United States Patent
Hoffmann et al.

(10) Patent No.: US 10,081,866 B2
(45) Date of Patent: Sep. 25, 2018

(54) EVAPORATION APPARATUS WITH GAS SUPPLY

(71) Applicant: Applied Materials, Inc., Santa Clara, CA (US)

(72) Inventors: Gerd Hoffmann, Bruchkoebel (DE); Sven Schramm, Kahl Am Main (DE); Roland Trassl, Giessen (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 1230 days.

(21) Appl. No.: 13/940,587

(22) Filed: Jul. 12, 2013

(65) Prior Publication Data

US 2015/0000598 A1    Jan. 1, 2015

(30) Foreign Application Priority Data

Jun. 28, 2013   (EP) .................... 13174290

(51) Int. Cl.
| | | |
|---|---|---|
| *C23C 16/448* | (2006.01) | |
| *C23C 14/24* | (2006.01) | |
| *C23C 14/00* | (2006.01) | |
| *C23C 14/08* | (2006.01) | |
| *C23C 14/56* | (2006.01) | |

(52) U.S. Cl.
CPC ........ *C23C 16/448* (2013.01); *C23C 14/0021* (2013.01); *C23C 14/081* (2013.01); *C23C 14/24* (2013.01); *C23C 14/243* (2013.01); *C23C 14/562* (2013.01)

(58) Field of Classification Search
CPC ............................ C23C 16/448; C23C 14/243
USPC .................................................. 118/726, 727
See application file for complete search history.

(56) References Cited

U.S. PATENT DOCUMENTS

| | | | | |
|---|---|---|---|---|
| 5,242,500 A | * | 9/1993 | Elvers ................... | C23C 14/562 118/718 |
| 2005/0147753 A1 | * | 7/2005 | Smith ................... | C23C 14/243 427/249.1 |

FOREIGN PATENT DOCUMENTS

| | | | |
|---|---|---|---|
| JP | 11335819 A | * | 12/1999 |
| JP | 2006-274308 A | | 10/2006 |
| JP | 2007270251 A | * | 10/2007 |
| JP | 2009-235545 A | | 10/2009 |
| WO | 2012/146312 A1 | | 11/2012 |

OTHER PUBLICATIONS

English abstract and translation for JP 2007-270251.*

(Continued)

*Primary Examiner* — Aiden Lee
(74) *Attorney, Agent, or Firm* — Patterson + Sheridan LLP

(57) ABSTRACT

An evaporation apparatus for depositing material on a substrate by a drum is described. The evaporation apparatus includes a first set of evaporation crucibles aligned in a first line a first direction for depositing evaporated material on the substrate; a first gas supply pipe extending in the first direction being arranged between at least one of the evaporation crucibles of the first set of evaporation crucibles and the drum; and a second gas supply pipe extending in the first direction for providing a gas between the first set of evaporation crucibles and the drum with openings shaped and positioned to improve the uniformity of the deposition of the material.

14 Claims, 8 Drawing Sheets

(56) References Cited

OTHER PUBLICATIONS

English abstract and translation for JP 11-335819.*
English abstract and translation for JP 2009-235545.*
European Search Report dated Aug. 19, 2013 for Application No. EP 13 17 4290.

* cited by examiner

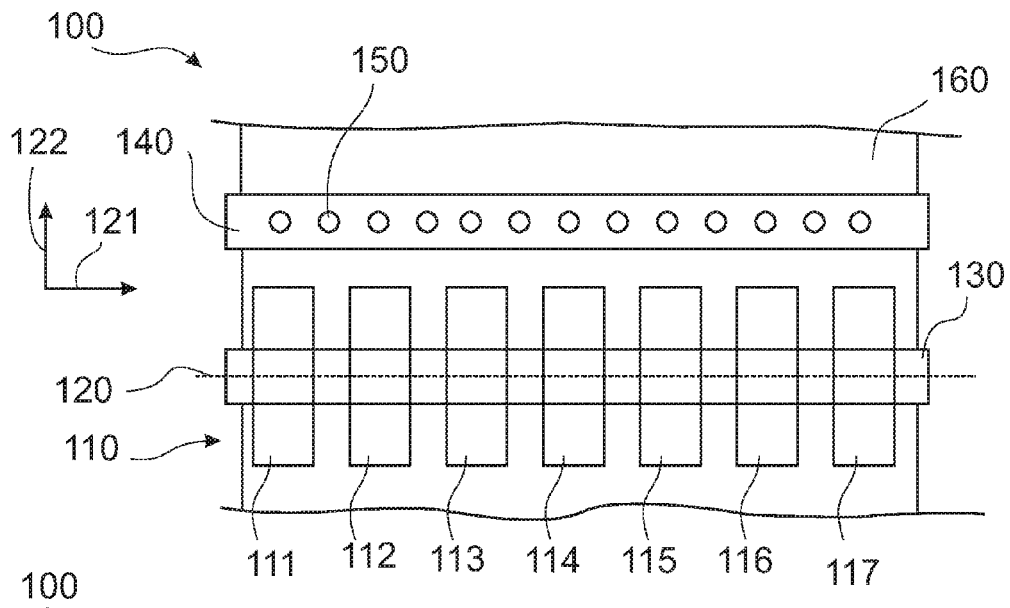
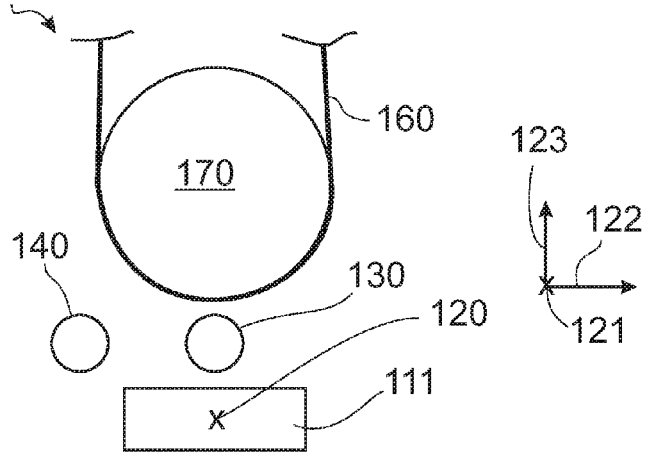
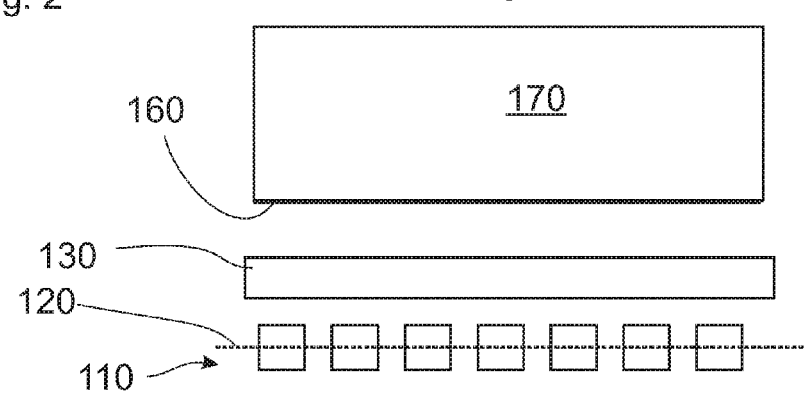
Fig. 1
Fig. 2
Fig. 3

EVAPORATION APPARATUS WITH GAS SUPPLY

TECHNICAL FIELD OF THE INVENTION

Embodiments of the present invention relate to an evaporation apparatus for depositing material on a substrate. Embodiments of the present invention particularly relate to an evaporation apparatus with a gas supply, specifically to an evaporation apparatus including an evaporation crucible and a gas supply.

BACKGROUND OF THE INVENTION

Depositing thin layers on a flexible substrate is a production process for many applications. The flexible substrates are thereby coated in one or more chambers of a flexible substrate coating apparatus. The flexible substrates, such as foils made of plastics or pre-coated papers, are guided on rolls or drums and pass in this way the source of deposition material. Possible applications of the coated substrate range from providing coated foils for the packaging industry to depositing thin films for flexible electronics and advanced technology applications, such as smartphones, flat screen TVs and solar panels.

Different deposition processes may be used to achieve a layer with the desired properties. For instance, in a thermal evaporation process, thin layers of aluminum are metallized onto flexible substrates. Substrates coated in such a way may for instance be used for the production of protective packaging or decorative materials. In further processes, such as in reactive coating processes, gas is supplied to the substrate additionally to an evaporated material from the material source in order to provoke a chemical reaction influencing the layer deposited on the substrate. By using such processes, several characteristics of the substrate may be controlled, such as barrier characteristics for water vapor or oxygen, and transparency characteristics of the finished product.

For the finished product, it is desirable to have a reliable and optically acceptable layer on the substrate in order to have a product of high quality. At the same time, the productivity of the deposition process has to be considered in so far as a slow process yielding a high quality product may not be acceptable for a customer due to the costs increasing with the production time. In known systems, the number of material sources may be adapted in order to improve the productivity, the guiding drums for the substrates may be adapted (such as cooled, or positioned in a suitable way) in order to achieve desired layer properties, and a control unit may monitor and optimize the process to avoid irregularities in the process operation.

However, irrespective of the measures taken, irregularities may still appear in the optical appearance of the coated substrate, which is not acceptable in case of packaging industry or decorative foils. In view of the above, it is an object of the present invention to provide an evaporation apparatus that overcomes at least some of the problems in the art.

SUMMARY OF THE INVENTION

In light of the above, an evaporation apparatus according to independent claim 1 and an evaporation apparatus according to independent claim 11 are provided. Further aspects, advantages, and features of the present invention are apparent from the dependent claims, the description, and the accompanying drawings.

According to one embodiment, an evaporation apparatus for depositing material on a substrate supported by a drum is provided. The evaporation apparatus includes a first set of evaporation crucibles aligned in a first line along a first direction for depositing evaporated material on the substrate, and a first gas supply pipe extending in the first direction and being arranged between at least one of the evaporation crucibles of the first set of evaporation crucibles and the drum. The evaporation apparatus further includes a second gas supply pipe extending in the first direction for providing a gas between the first set of evaporation crucibles and the drum with openings shaped and positioned to improve the uniformity of the deposition of the material.

According to another embodiment, evaporation apparatus for depositing material on a substrate supported by a drum is provided. The evaporation apparatus includes a first set of evaporation crucibles aligned along a first line extending in a first direction and a second set of evaporation crucibles aligned along a second line extending in the first direction, and a first gas supply extending in the first direction configured for supplying gas for the first set of evaporation crucibles and the second set of evaporation crucibles. The evaporation apparatus further includes a second gas supply extending in the first direction for providing gas for the first set of evaporation crucibles and comprising a pipe, wherein the pipe comprises gas outlet openings substantially at the positions of the evaporation crucibles of the first set of evaporation crucibles along the first direction and is closed at the positions of the evaporation crucibles of the second set of evaporation crucibles along the first direction.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 1 shows a schematic top view of an evaporation apparatus according to embodiments described herein;

FIG. 2 shows a schematic front view of the evaporation apparatus shown in FIG. 1;

FIG. 3 shows a schematic side view of the evaporation apparatus shown in FIG. 1;

DETAILED DESCRIPTION OF EMBODIMENTS

Figure 4:
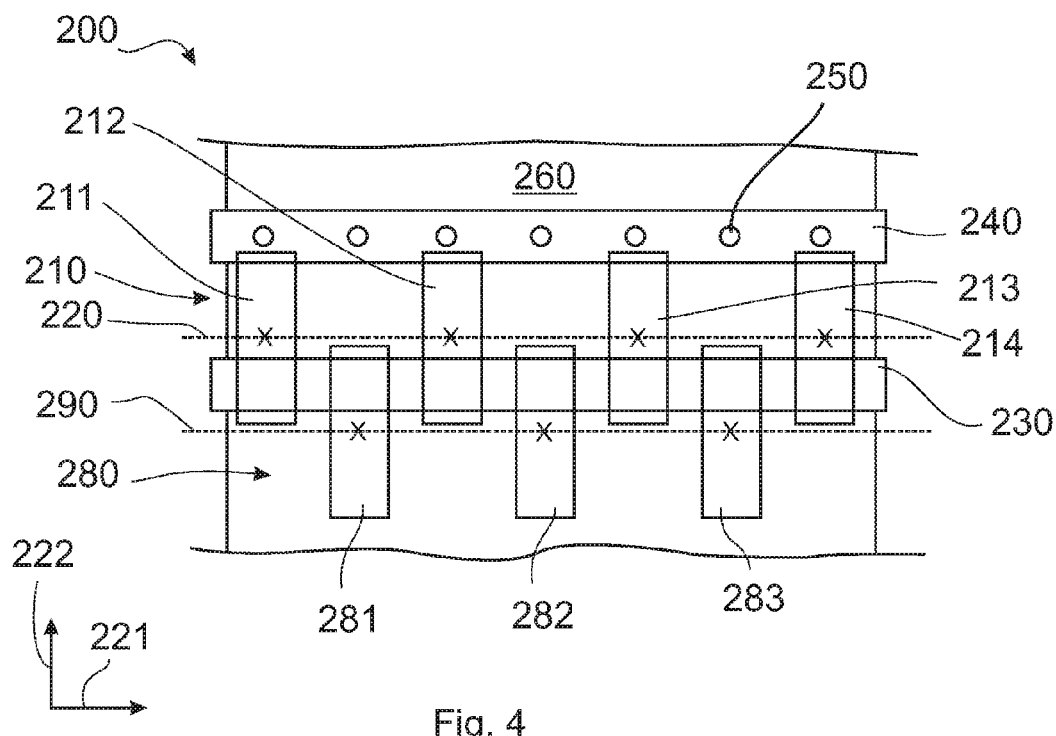
FIG. 4 shows a schematic top view of an evaporation apparatus having two sets of crucibles according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

In known systems, such as reactive evaporation systems, substrates are coated with a material layer. However, sometimes the optical appearance of the finished product, such as a coated foil, is not satisfying. The optical appearance is one of the factors considered by the customer when deciding about buying a product or not. For instance, in case the coated substrate should be used as a transparent substrate providing defined barrier characteristics, the optical appearance is a criterion for the product not to be neglected. While the optical appearance is desirable to improve, it is at the same time preferred that the production costs do not increase. Also, the productivity should remain constant, or should even increase. Thus, it is desirable to provide an evaporation system, which is able to improve the optical appearance of the finished product, while offering an easy and reasonable priced process.

According to some embodiments described herein, an evaporation apparatus is provided for depositing material on a substrate supported by a substrate support, such as a drum. FIG. 1 shows an example of an evaporation apparatus 100 as described herein and a substrate 160 to be coated. The evaporation apparatus 100 may include a first set of evaporation crucibles 110 aligned in a first line 120 along a first direction 121 for depositing evaporated material on the substrate 160. The first set of evaporation crucibles 110 shown in FIG. 1 exemplarily includes crucibles 111 to 117. Generally, the first direction is shown in FIG. 1 as an arrow denoted with reference sign 121. A second direction 122 may be defined as being substantially perpendicular to the first direction 121. In one embodiment, the second direction is the direction, in which the substrate 160 moves during the deposition process.

In FIG. 1, a first gas supply pipe 130 is shown between at least one of the evaporation crucibles 111, 112, 113, 114, 115, 116, 117 of the first set of evaporation crucibles 110 and the substrate support. The substrate support is exemplarily shown in FIG. 2 as drum 170. The embodiment shown in FIG. 1 also shows a second gas supply pipe 140 for providing a gas between the first set of evaporation crucibles 110 and the substrate support 170 with openings 150 shaped and positioned to improve the uniformity of the deposition of the material.

It has been found that improving the uniformity of the material deposition improves the optical appearance and the uniformity of the barrier function over the length and the width of the coated substrate. Further, providing a second gas supply for providing gas for the first set of crucibles, and, in particular, shaping and positioning the openings in the second gas supply pipe accordingly, improves the uniformity of the coated layer in an uncomplicated and cost efficient way.

The evaporation apparatus may be an evaporation apparatus for a reactive evaporation process. According to some embodiments, the herein described crucibles may be adapted for providing evaporated material on the substrate to be coated. In one embodiment, the crucibles may provide one component of the material to be deposited as a layer on the substrate. For instance, the crucibles described herein may include a metal, which is evaporated in the crucibles. According to some embodiments, the evaporated material from the crucibles may react with a further component in the evaporation apparatus for forming the material or the desired layer to be deposited on the substrate.

In case the evaporation apparatus is a reactive evaporation apparatus, the layer uniformity is improved by the herein described embodiments by providing a first component of the material to be deposited from a set of crucibles, such as the first set of crucibles, and a second component of the material to be deposited by the first gas supply pipe and a second gas supply pipe having defined openings. In one example, the component provided by the crucibles is a metal, such as aluminum, and the second component is a reactive gas like oxygen. The aluminum from the crucible together with the oxygen from the first and/or second gas supply tube may form a layer of $AlO_x$ on the substrate in the evaporation apparatus according to embodiments described herein. In a further example, the material provided by the crucibles is Cu and the gas provided by the gas supply pipes is oxygen so as to form a $CuO_x$ layer on the substrate. According to some embodiments, any material, specifically any metal, may be used as material in the crucibles as long as the vapor pressure of the material may be achieved by thermal evaporation.

Furthermore, a set of crucibles as referred to herein should be understood as a set of at least two crucibles. In particular, a set of crucibles may be described as being at least two crucibles aligned in a line. For instance, the line along which the crucibles of a crucible set are aligned may run through the center of the crucibles. Generally, the center of a crucible may be defined as the geometrical center of the crucible in the first direction and in the second direction as mentioned above, e.g. a center in the length and width direction of the crucible. According to further embodiments, the center of a crucible may be defined as being the center of gravity of the crucible.

In one embodiment, the crucibles in a set of crucibles may be from the same type or have substantially the same size. While not shown in the schematic views of the figures, the crucibles described herein may be equipped with a material supply for delivering the material to be evaporated by the crucibles to the crucibles. Further, the crucibles described herein may be configured for heating the material delivered to the crucibles to the melting and further to the evaporation temperature.

According to some embodiments, a crucible as described herein may also be comprised of an evaporator boat. For instance, an evaporator boat may include in one frame an arrangement of crucibles. In the embodiments described herein, a set of crucibles may for instance also be a set of evaporator boats. In one example, a set of evaporator boats may include two evaporator boats being arranged along a line. However, for the sake of a better overview, such evaporator boats are also referred to as a crucible. According to some embodiments, the term "crucible" is synonymously used for the term "evaporation crucible."

FIG. 2 shows a schematic front view of the evaporation apparatus of FIG. 1. The substrate 160 is guided and supported by a drum 170 in the embodiment shown in FIG. 2. In the front view, the first crucible 111 of the first set of evaporation crucibles 110 can be seen. The first line 120 along the first direction 121 is indicated by a cross in the front view of FIG. 2. Between the drum 170 and the crucible 111, the first gas supply pipe 130 extends in the first direction. Also, the second gas supply pipe 140 for improving the layer uniformity can be seen in FIG. 2. The second gas supply pipe is exemplarily shown as being at the same height as the first gas supply pipe 130 in a third direction 123 being substantially perpendicular to the first direction 121 and the second direction 122.

The substrate 160 is subjected to the material evaporated by the first crucible set 110 and to the gas provided by the first gas supply 130 and the second gas supply 140. During operation, the substrate 160 is coated with a layer including the material evaporated by the crucibles and the gas supplied by the gas supply pipes. The layer may also include reactive products of the components provided by the crucible and the gas supply pipes.

A substrate as referred to herein may be understood as a substrate suitable for being coated in an evaporation apparatus, in particular in a reactive evaporation apparatus. For instance, the substrate may include a web, e.g. a web made from or containing plastics and polymers (such as polypropylene, PET substrates, substrates made from or containing OPP, BOPP, CPP, PE, LDPE, HDPE, OPA, PET), pre-coated paper, or biodegradable films (such as PLA).

Generally, the first gas supply pipe may be configured to be the "main" gas supply pipe delivering the majority of the reactive gas for the layer deposition. According to some embodiments, the first gas supply pipe may be arranged substantially at the center of an evaporation zone. For instance, as can exemplarily be seen in FIG. 2, the first gas supply pipe 130 may be arranged above the center of the crucible 111. In some embodiments, the first gas supply pipe may be located in an area between a crucible and the center of the drum, especially the first gas supply pipe may be arranged at a line extending substantially perpendicular from the crucible surface to the center of the drum. According to some embodiments, which may be explained in detail below, the first gas supply pipe may be located between a second gas supply pipe and a third gas supply pipe.

FIG. 3 shows a side view of the evaporation apparatus 100 shown in FIGS. 1 and 2. The substrate 160 is guided over the drum 170 and thereby passes the first set of crucibles 110 and the first gas supply pipe 130. The second gas supply pipe 140 is behind the first gas supply 130.

FIG. 4 shows an embodiment of the evaporation apparatus, which may be combined with other embodiments described herein, such as the embodiment shown and described with respect to FIGS. 1 to 3. The embodiment of an evaporation apparatus 200 shown in FIG. 4 includes a first set of crucibles 210 including evaporation crucibles 211, 212, 213, and 214. The crucibles of the first set of crucibles 110 are aligned along line 220. The first line 220 runs through the center of the crucibles 211, 212, 213 and 214. The center of a crucible is indicated by a cross in the crucibles in FIG. 4. A first gas supply pipe 230 is provided between the evaporation crucibles 211, 212, 213, 214 of the first set of crucibles 210 and the substrate support 270 (which can exemplarily be seen as a drum in FIG. 5) supporting substrate 260. The second gas supply pipe 240 includes openings 250 for improving the deposition uniformity on the substrate 260.

The evaporation apparatus 200 may further include a second set of crucibles 280 including crucibles aligned in a second line 290 along the first direction 221. The second set of evaporation crucibles 280 includes crucibles 281, 282, 283, the center of which are indicated by crosses. The second line 290 runs through the centres of the crucibles 281, 282, 283.

FIG. 4 shows the first set of crucibles including four crucibles, and the second set of crucibles including three crucibles. However, the number of crucibles shown in the figures described herein, is an example for the sake of a better overview. For instance, the number of crucibles in the first set of crucibles and the second set of crucibles may be the same in one embodiment. The number of crucibles, either in the first set of crucibles or in the second set of crucibles, or in both, may typically be between 2 and 70, more typically between 2 and 40, and even more typically between 4 and 20. In one example, the first set of crucibles includes two crucibles and the second set of crucibles includes two crucibles. In a further example, the first set of evaporation crucibles and the second set of evaporation crucibles may each include seven crucibles.

In FIG. 4, the first line 220, along which the first set of crucibles 210 is arranged, and the second line 280, along which the second set of crucibles 280 is arranged, are displaced from each other in the second direction 222. Generally, the second direction 222 may be substantially perpendicular to the first direction, along which the first line and the second line run. In the embodiment shown in FIG. 4, the crucibles 281, 282, 283 of the second set of crucibles 280 are also displaced in the first direction compared to the crucibles 211, 212, 213, 214 of the first set of crucibles 210. In one example, the displacement of the first line to the second line may be in the range of typically between about 20 mm and about 90 mm, more typically between about 40 mm and about 80 mm, and even more typically between about 60 mm and about 80 mm. According to some embodiments, the displacement of the crucibles of the first set of crucibles compared to the second set of crucibles in the first direction may be in the range of typically between 0 mm to about 80 mm, more typically between 0 mm and about 60 mm, and even more typically between 0 mm and about 40 mm.

According to some embodiments, the second gas supply pipe 240 improves the uniformity of the layer deposition by providing openings 250 with a defined shape and position. In the embodiment shown in FIG. 4, the position of the openings 250 of the second gas supply pipe 240 corresponds to the position of the crucibles of the first and second set of crucibles. Also, in the embodiment of FIG. 4, the number of openings 250 in the second gas supply pipe corresponds to the number of crucibles in the first and second set of crucibles. However, this should be understood as being an example. The number of openings in the herein described gas supply pipes may correspond to the number of the crucibles, but may also be independent from the number of crucibles.

The features described with respect to FIG. 4, such as the displacement of the first line to the second line in the second direction and/or the displacement of the crucibles of the first set of crucibles compared to the second set of crucibles in the first direction and/or the correspondence of the opening position to the crucible position may be used in other herein described embodiments and is not limited to the embodiment shown in FIG. 4. For instance, the displacement may be used in embodiments of the evaporation apparatus described in the following, such as the evaporation apparatuses shown in FIGS. 6 to 17.

Figure 5:
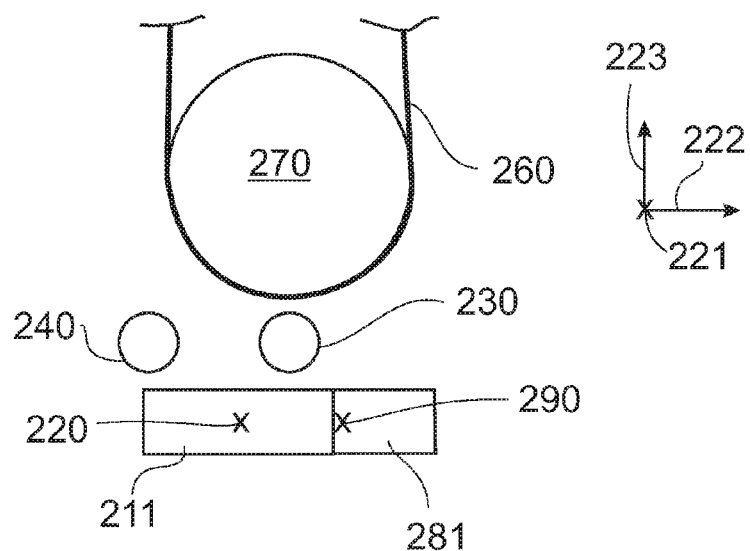
FIG. 5 shows a schematic front view of the evaporation apparatus shown in FIG. 4.

FIG. 5 shows a front view of the evaporation apparatus 200 shown in FIG. 4. The substrate 260 is supported and guided by drum 270. The first crucible 211 of the first set of crucibles 210 as well as the first crucible 281 of the second set of crucibles 280 can be seen in the front view of FIG. 5. The crosses in the crucibles 211 and 281 indicate the first line 220 and the second line 290 running in the first direction 221. The first gas supply pipe 230 is located between the crucibles of the first set of crucibles. The second gas supply pipe 240 is located and configured to improve the coating uniformity. As can be seen in FIG. 5, the first gas supply pipe 230 and the second gas supply pipe 240 are displaced from one another in the second direction 222.

While the first gas supply pipe is described as being arranged between the first set of crucibles and the substrate support 270, it should be understood that the first gas supply pipe may also be arranged between the first set of crucibles and the substrate support and between the second set of crucibles and the substrate support. For instance, as can be seen in FIG. 4, the crucibles of the first set of crucibles and the crucibles of the second set of crucibles may have overlapping portions in the second direction. The first gas supply pipe 230 is thus arranged not only between the first set of crucibles and the substrate support but also between the second set of crucibles and the substrate support. The skilled person will understand that the features of overlapping portions of the first and second set of crucibles as well as the feature of the first gas supply being also arranged between the second set of crucibles and the substrate support is not limited to the embodiment of FIGS. 4 and 5, with respect to which they are exemplarily described. Rather, the described features may be combined with other embodiments described herein, such as embodiments relating to further components of the evaporation crucible or embodiments relating to the positioning and the shaping of the openings in the gas supply pipes.

Figure 6:
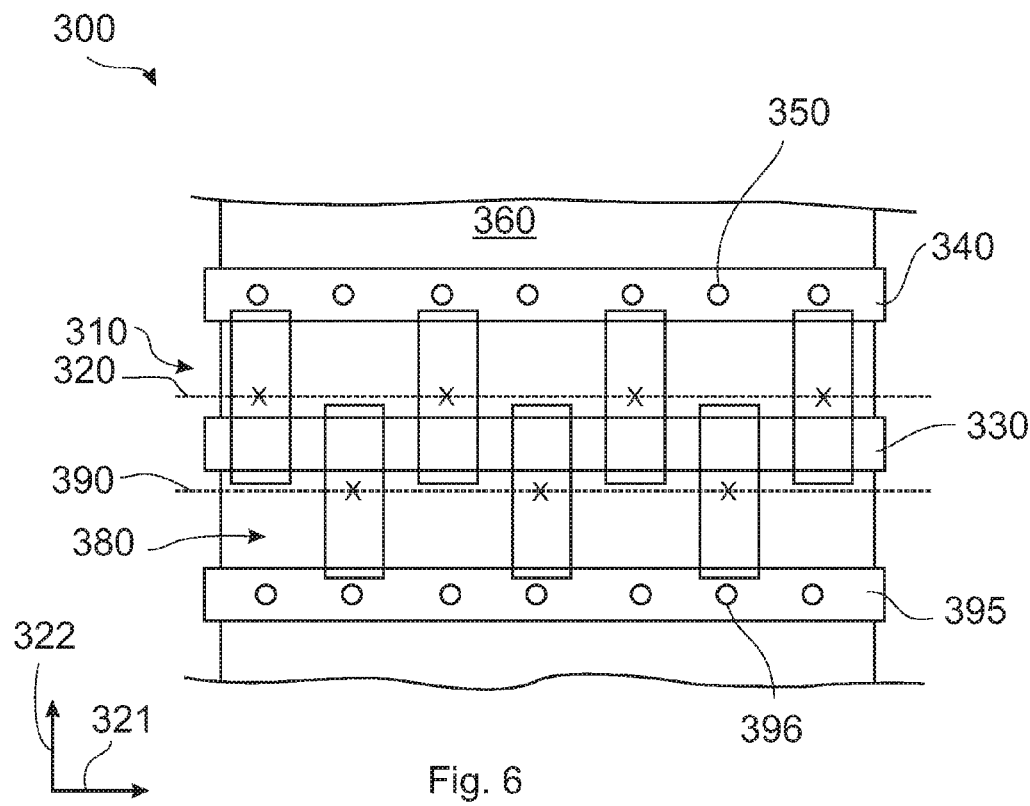
FIG. 6 shows a schematic top view of an evaporation apparatus having a first, second, and third gas supply according to embodiments described herein.

FIG. 6 shows an embodiment of an evaporation apparatus 300 including a first set of crucibles 310 arranged along a first line 320 extending in the first direction 321 and a second set of crucibles 380 arranged along a second line 390 extending in the first direction 321. The above described features of the arrangement of the first set of crucibles and the second set of crucibles described with respect to FIGS. 4 and 5 may also be applied to the embodiment shown in FIGS. 6 and 7. The evaporation apparatus 300 also includes a first gas supply pipe 330 and a second gas supply pipe 340, which may be like the first gas supply pipe and the second gas supply pipe as described above. The evaporation apparatus 300, however, includes a third gas supply pipe 395 extending in the first direction 321 for providing a gas between the second set of evaporation crucibles 390 and the drum 370 with openings 396 shaped and positioned to improve the uniformity of the deposition of the material on the substrate 360.

Generally, a gas supply pipe "for providing" a gas between a set of crucibles (or a crucible) and the substrate support (such as a drum) should be understood as a gas supply pipe configured to provide a gas between a set of crucibles (or a crucible) and the substrate support. The gas supply pipe may be configured to supply gas between the crucible and the substrate support by being positioned and/or shaped so as to deliver gas in the respective space. In one embodiment, the gas outlets or openings of a gas supply pipe may be adapted, such as by adapting the shape or the position of the openings, for providing gas between a crucible and the substrate support. According to some embodiments, the gas supply pipe or the openings in the gas supply pipe may be directed towards the space, in which gas is to be supplied. Generally, a gas supply pipe is configured to provide gas between the crucible set and the substrate support if the majority of the gas amount delivered by the gas supply is supplied in the space between the crucible and the substrate support.

Figure 7:
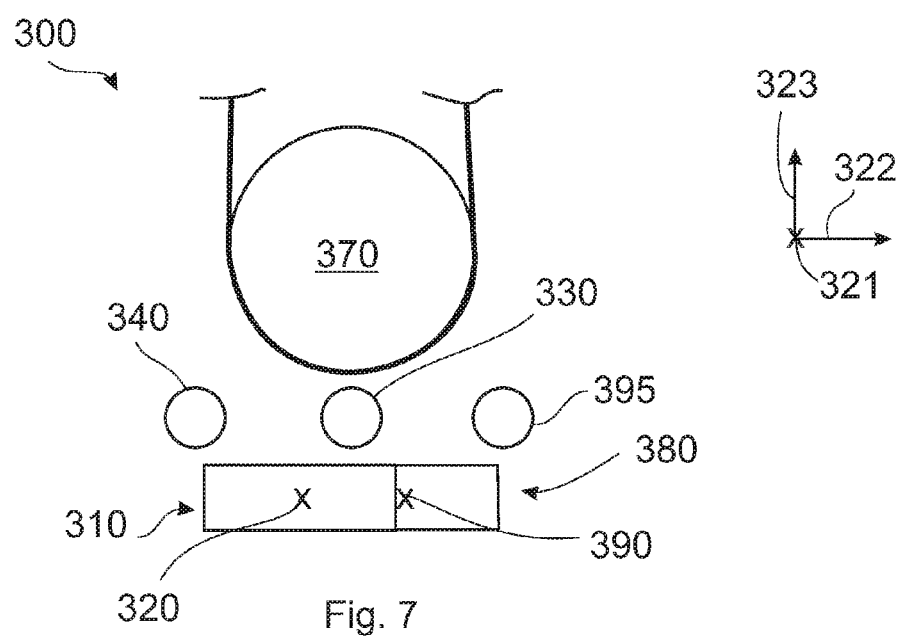
FIG. 7 shows a schematic front view of the evaporation apparatus shown in FIG. 6.

FIG. 7 shows a front view of the evaporation apparatus 300 of FIG. 6. The displacement of the first set of crucibles 310 and the second set of crucibles 380 in the second direction 322 can be seen as well as the first line 320 and the second line 390 extending in the first direction 321. The third gas supply pipe 395 is arranged between the second set of crucibles 380 and the drum 370 supporting and guiding the substrate 360. According to some embodiments, the first gas supply pipe is located between the second gas supply pipe and the third gas supply pipe in the second direction.

In the embodiment shown in FIGS. 6 and 7, the uniformity of the deposited layer is influenced by the second gas supply pipe 340 supplying gas to the first set of crucibles 310 through openings 350 and the third gas supply pipe 395 supplying gas to the second set of crucibles 380 through openings 396. The presence of two additional gas supply pipes apart from the first gas supply pipe improves the consistency of the ratio between evaporated material from the crucibles and reactive gas, which, in turn, results in a constant deposition of material on the substrate. In particular, the openings 350 of the second gas supply pipe and the openings 396 of the third gas supply pipe may further be positioned (e.g. by the correspondence of the opening position to the crucible position) so as to improve the layer uniformity.

Figure 8:
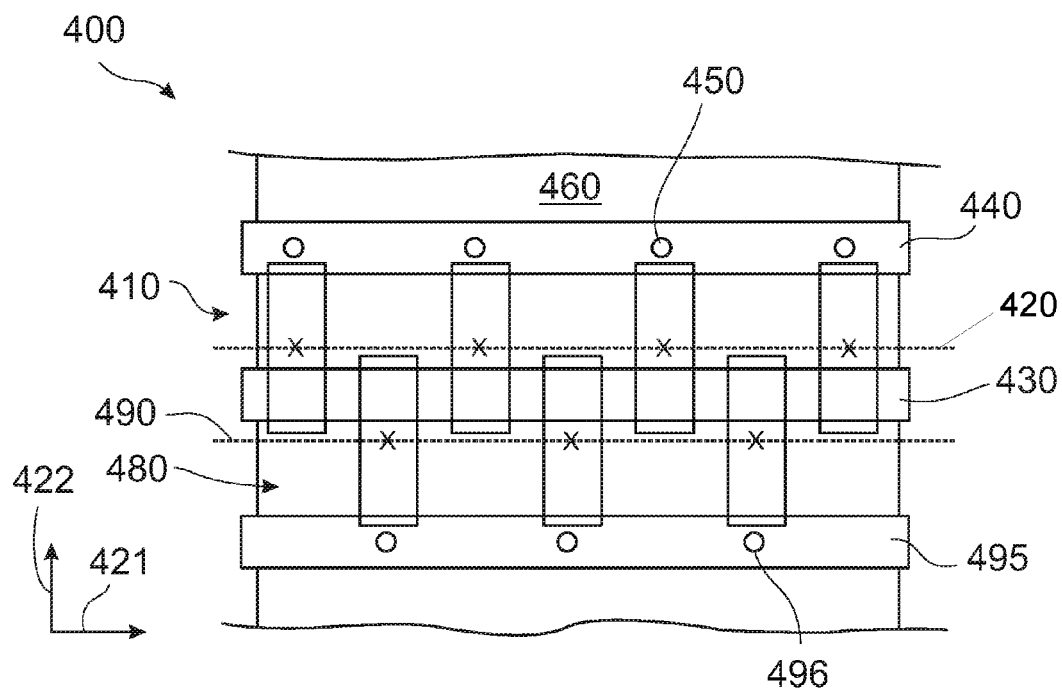
FIG. 8 shows a schematic top view of an evaporation apparatus with gas supply pipes according to embodiments described herein.

FIG. 8 shows an embodiment of an evaporation apparatus 400 including a first set of crucibles 410 arranged along a first line 420 extending in the first direction 421 and a second set of crucibles 480 arranged along a second line 490 extending in the first direction 421. The centres of the crucibles are exemplarily indicated by a cross. The evaporation apparatus 400 further includes a first gas supply 430 between at least the first set of crucibles 410 and the substrate support supporting substrate 460. In the embodiment shown in FIG. 8, the first gas supply 430 is arranged between the first set of crucibles 410 and the substrate support supporting substrate 460 and between the second set of crucibles 480 and the substrate support supporting substrate 460. The crucibles of the first set of crucibles 410 and the crucibles of the second set of crucibles 480 overlap in the second direction 422.

According to some embodiments, the evaporation apparatus 400 further includes a second gas supply 440 for providing a gas between the first set of evaporation crucibles and the substrate support and a third gas supply 495 for providing a gas between the second set of evaporation crucibles 480 and the substrate support. The second gas supply pipe 440 and the third gas supply pipe 495 have openings 450, 496, respectively. The openings in the second and the third gas supply pipes may be shaped and positioned to improve the uniformity of the deposition of the material. In the embodiment shown in FIG. 8, the openings of the second gas supply pipe 440 are substantially at the positions of the evaporation crucibles of the first set of evaporation crucibles 410 along the first direction 421, while the second gas supply pipe 440 is substantially closed at the positions of the evaporation crucibles of the second set 480 of evaporation crucibles along the first direction 421. The openings of the third gas supply pipe 495 are substantially located at the positions of the evaporation crucibles of the second set of evaporation crucibles 480 along the first direction 421, while the third gas supply pipe 495 is substantially closed at the positions of the evaporation crucibles of the first set of evaporation crucibles 410 along the first direction 42 in the embodiment shown in FIG. 8.

The term "substantially" as used herein may mean that there may be a certain deviation from the characteristic denoted with "substantially." For instance, the term "substantially at a position" refers to a position, which may deviate from the exact position. In one example, the position described with "substantially" may deviate from the exact position by several percent of the extension of the element (such as about 15%), on which the position lies. As an example, such as in the case that a gas supply pipe extends over a length of about 1250 mm to about 4450 mm in the first direction, the deviation of a position at the gas supply pipe denoted with "substantially" may be in the range of up to 190 mm to about 670 mm.

It should be understood that the features described with respect to FIGS. 6 to 8 (such as the second set of crucibles, or the arrangement of the two crucible sets to each other, or providing the second and third gas supply pipe, or the second and/or the third gas supply pipe having openings at the positions corresponding to the positions of the crucibles of the first and second set of crucibles, respectively) may be combined with other embodiments described herein, for example embodiments described with respect to FIGS. 1 to 5, or 9 to 17 as long as they do not contradict each other.

Generally, an opening being positioned corresponding to the position of a further component of the evaporation apparatus, such as a crucible, may be positioned dependent on the position of the further component. According to some embodiments, an opening being positioned corresponding to the position of a crucible may be located at the same position as the crucible in one direction, but may be displaced in another direction. For instance, an opening may be displaced from the crucible in the second direction, but may have substantially the same position as the crucible in the first direction.

In the embodiment shown in FIG. 8, the crucibles can be described as being arranged in a staggered manner due to the displacement of the first line and the second line in the second direction, and in particular due to the additional displacement of the crucibles of the first set and the crucibles of the second set in the first direction. The installation of an additional gas line on each side of the crucible sets with openings (which may be configured to act as gas nozzles) at the position of the crucible that is closest to each gas line is beneficial for improving the uniformity of the coated layer on the substrate. One effect of the embodiment shown in FIG. 8 is that there is one gas supply pipe for each set of crucibles providing additional gas (such as oxygen) at the location where there may not be sufficient oxidation due to the amount of evaporated material from the crucibles. The result of the embodiment may be a uniform appearance of the transparent barrier layer directly after coating. The result may be achieved in a cost efficient way by providing the additional gas supply with the respectively positioned and/or spaced openings.

Staggered arrangements of crucibles are known in evaporation systems. In these systems, aluminum is evaporated in a staggered crucible arrangement and oxygen is fed uniformly into the middle of the aluminum cloud across the width of the evaporator.

It has been found that, due to the staggered arrangement of the crucibles in the known systems, there are positions (e.g. at the position of the crucibles) where there is a slightly different stoichiometry of the $AlO_x$ layer resulting in visible stripes on the coated substrate. While these stripes have no big impact on the barrier performance of the coated substrate, the visual appearance directly after coating is not uniform.

With the evaporation apparatus according to embodiments described herein, the stripes resulting from the staggered crucible arrangement may be avoided without omitting the staggered arrangement, which improves the optical appearance of the finished product and increases the acceptance of the product.

Figure 9:
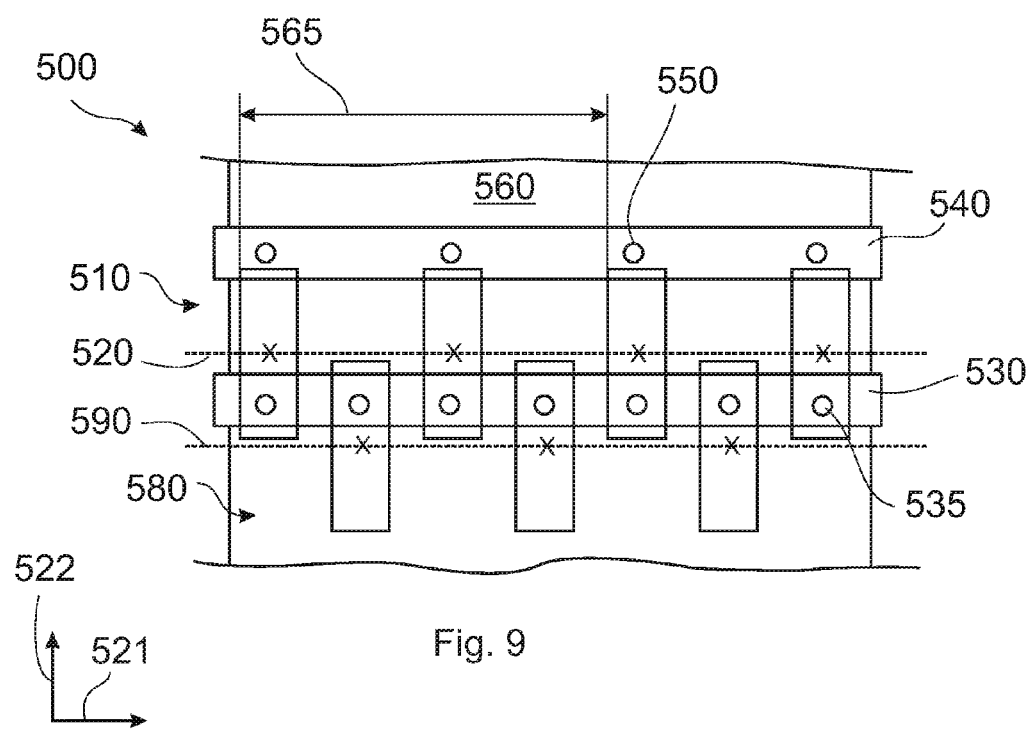
FIG. 9 shows a schematic top view of an evaporation apparatus with gas supply pipes having openings according to embodiments described herein.

FIG. 9 shows an embodiment of an evaporation apparatus 500 including a first set of crucibles 510 along a first line 520 and a second set of evaporation crucibles 580 arranged along a second line 590. A first gas supply pipe 530 is provided at least between the first set of crucibles 510 and the substrate support supporting substrate 560. The first gas supply pipe 530 has openings 535 for supplying gas to the substrate 560. The evaporation apparatus 500 further includes a second gas supply pipe 540 for providing a gas between the first set of evaporation crucibles 510 and the substrate support. In the embodiment shown in FIG. 9, the openings 550 of the second gas supply pipe 540 are shaped and positioned to improve the uniformity of the deposition of the material by being located at positions corresponding substantially to the positions of the crucibles of the first set of crucibles 510 along the first direction 521. Generally, the number of openings in the first gas supply pipe may depend on the number of crucibles present in the evaporation apparatus. According to some embodiments, also the number of openings in the second and/or in a third gas supply pipe may depend on the number of crucibles or the number of crucibles of a respective crucible set.

In the embodiment shown in FIG. 9, the number of openings in the first gas supply pipe 530 is larger than the number of openings in the second gas supply pipe 540, particularly the number of openings in the first gas supply pipe 530 is larger than the number of openings in the second gas supply pipe per length unit 565. The length unit 565 exemplarily shown in FIG. 9 extends in the first direction over two crucibles of the first set of crucibles 510.

In the embodiment shown by FIG. 9, the second gas supply pipe 540 has only openings 550 at the positions of the crucibles of the first set of crucibles 510, while the first gas supply pipe 530 has openings 535 at the positions of the crucibles of the first set of crucibles 510 and the second set of crucibles 580. The number of openings in the first gas supply pipe 530 is thus twice as large as the number of openings in the second gas supply pipe 540 per length unit 565.

However, it should be understood that FIG. 9 shows merely an example and that the relation of openings of the first gas supply pipe and the second gas supply pipe may deviate from the described embodiment. For instance, the number of openings in the first gas supply pipe may be three times, four times, or even five or more times larger than the number of openings in the second gas supply pipe. In one embodiment, the number of openings of the first gas supply pipe is not an integer multiple of the number of openings in the second gas supply pipe. For instance, the number of openings in the second gas supply pipe is independent from the number of openings in the first gas supply pipe, but differs from the number of openings of the first gas supply pipe per length unit.

According to one embodiment, which may be combined with other embodiments described herein, the openings of the first gas supply pipe may be directed towards a shielding device, which homogenizes the gas distribution in the first direction of the evaporation apparatus. With a shielding device, a constant gas distribution may be achieved over the evaporator width in the first direction in the region of the first gas supply pipe. Alternatively, for achieving a constant gas distribution, a plurality of gas openings in the first gas supply pipe may be provided.

According to some embodiments, the length unit may be measured depending on the crucibles, but may also be defined independent from the crucibles. For instance, the length unit may be a fixed value, or may depend on the width of the substrate to be coated, or the like.

The second gas supply pipe of the embodiment of FIG. 9 helps to improve the uniformity of the deposited layer by adapting the number of the openings to the presence of evaporated material from the crucibles. Thus, the uniformity is improved by taking into account the stoichiometric conditions.

It should be understood that the features described with respect to FIG. 9 may also be used in an embodiment described before, such as an evaporation apparatus having only one set of crucibles, or an evaporation apparatus having a second set of crucibles and a third gas supply pipe, or an evaporation apparatus having a gas supply pipe with openings corresponding to the position of the crucibles, or further embodiments of an evaporation apparatus described herein. For instance, the embodiment shown in FIG. 9 may also be combined with features shown in FIGS. 10 to 17, as long as they do not contradict each other.

Figure 10:
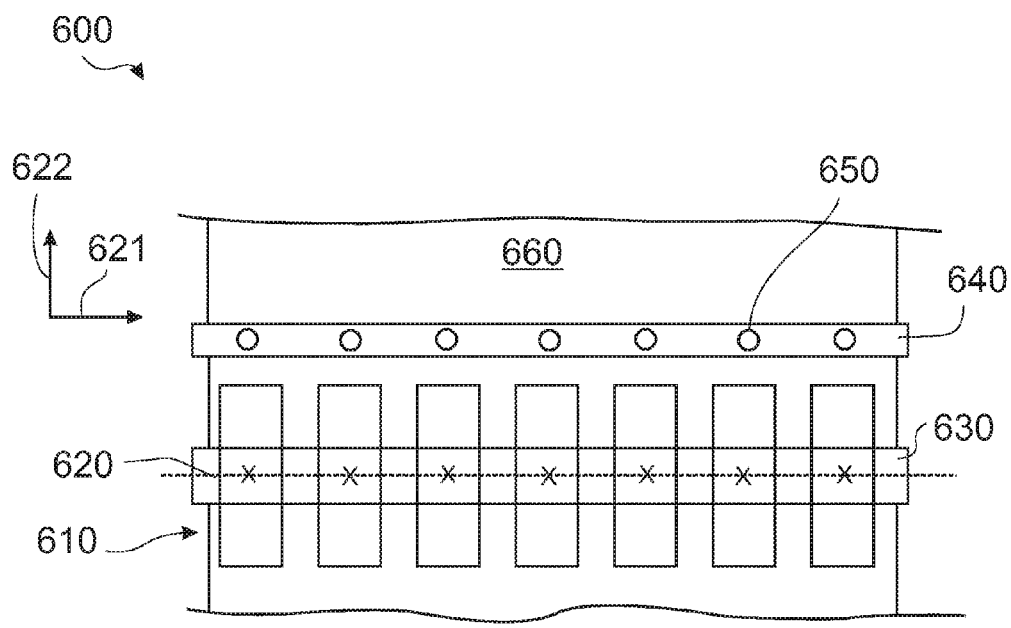
FIG. 10 shows a schematic top view of an evaporation apparatus with a first and a second gas supply pipe having openings according to embodiments described herein.

FIG. 10 shows an embodiment of an evaporation crucible 600 including a first set of crucibles 610 aligned along a first line 620 extending in a first direction 621, which may extend substantially perpendicular to a second direction 622. The second direction 622 may be the direction of movement of the substrate 660 to be coated. The evaporation apparatus 600 further includes a first gas supply pipe 630 and a second gas supply pipe 640 having openings 650. The first and the second gas supply pipes 630 and 640 may be first and second gas supply pipes as described before.

Figure 11:
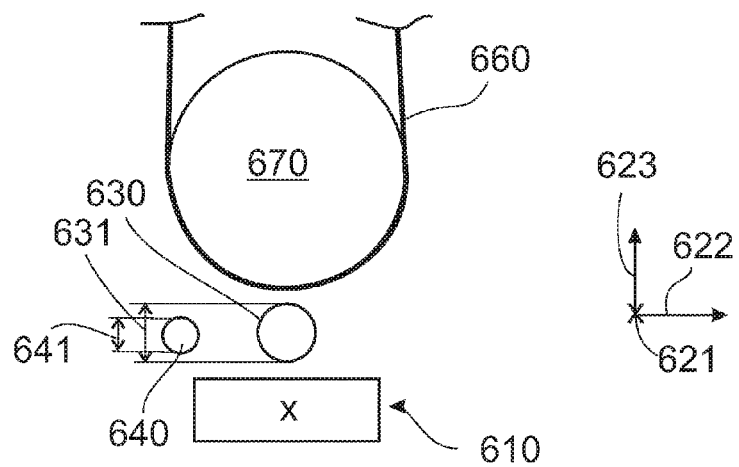
FIG. 11 shows a schematic front view of the evaporation apparatus shown in FIG. 10.

In the embodiment shown in FIG. 10, the diameter of the second gas supply pipe 640 differs from the diameter of the first gas supply pipe 630. The difference of the diameter can be seen in FIG. 11, which is a front view of the embodiment shown in FIG. 10. The second gas supply pipe 640 has a diameter 641. The first gas supply pipe 630 has a diameter 631. As can be seen in FIG. 11, the diameter 641 is smaller than the diameter 631.

The embodiment described with respect to FIG. 10 may improve the uniformity by providing openings in a second gas supply pipe that has a smaller diameter than the first gas supply pipe. Thereby, the stoichiometric conditions as well as the fluidic characteristics of the gas flow in the supply pipes are taken into account for ensuring a uniform deposition of the material on the substrate.

It should be understood that the features described with respect to FIGS. 10 and 11 are not only applicable in the embodiment shown in FIGS. 10 and 11. Rather, the feature of differing diameters of the gas supply pipes may be combined with other embodiments described herein, such as the embodiments of FIGS. 1 to 9 and 12 to 17. For instance, the differing diameter may also be applied to embodiments having three gas supply pipes. Also, the third gas supply pipe may have a diameter differing from the diameter of the first gas supply pipe. Further, the feature of differing diameters may be applied in an embodiment, in which the second and/or third gas supply pipe is displaced from the first gas supply pipe in the second direction 622 being substantially perpendicular to the first direction 621.

Figure 12:
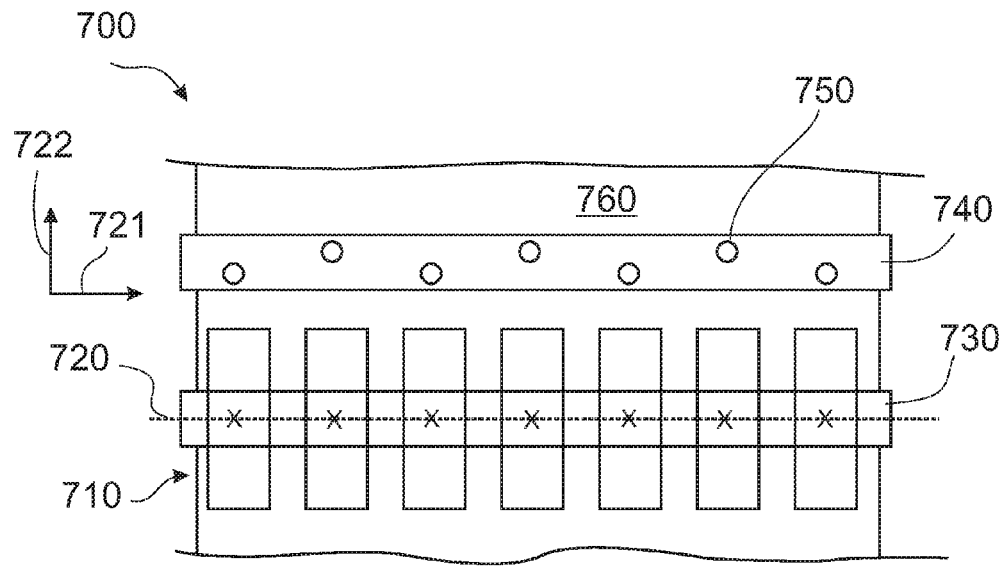
FIG. 12 shows a schematic top view of an evaporation apparatus with a first gas supply pipe and a second gas supply pipe having openings according to embodiments described herein.

FIG. 12 shows an embodiment of an evaporation crucible 700 including a first set of crucibles 710 aligned along a first line 720 extending in a first direction 721, which may extend substantially perpendicular to a second direction 722. The second direction 722 may be the direction of movement of the substrate 760 to be coated. The evaporation apparatus 700 further includes a first gas supply pipe 730 and a second gas supply pipe 740 having openings 750. The first and the second gas supply pipes 730 and 740 may be first and second gas supply pipes as described before.

In FIG. 12, the openings 750 of the second gas supply pipe 740 may be displaced with respect to each other in the second direction. However, while FIG. 12 only shows a second gas supply pipe having displaced openings 750, a third gas supply pipe may be provided as described before. In one embodiment, the third gas supply may also have openings being displaced in the second direction. The third gas supply pipe may have displaced openings additionally or alternatively to the displaced openings of the second gas supply pipe.

The displacement of the openings of the second and/or third supply pipe in the second direction may further enlarge the area supplied by the gas, and, thus, may improve the uniformity of the deposition.

Figure 13:
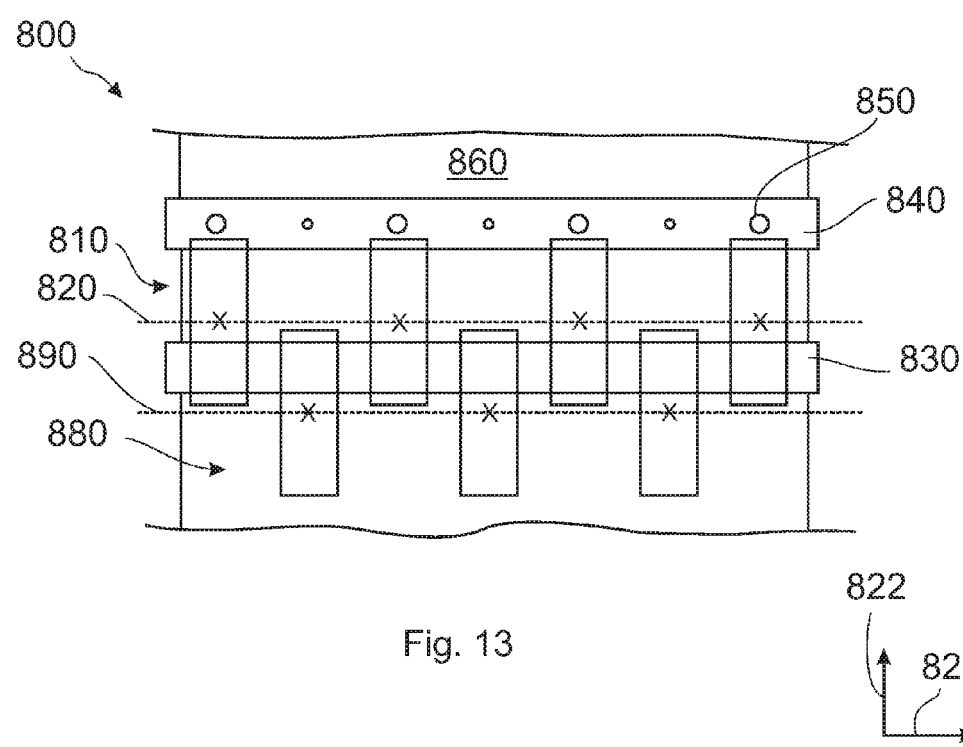
FIG. 13 shows a schematic top view of an evaporation apparatus with a first gas supply pipe and a second gas supply pipe having openings according to embodiments described herein.

FIG. 13 shows an embodiment of an evaporation crucible 800 including a first set of crucibles 810 aligned along a first line 820 extending in a first direction 821, which may extend substantially perpendicular to a second direction 822. The second direction 822 may be the direction of movement of the substrate 860 to be coated. Also, a second set of crucibles 880 is provided aligned along a second line 890 extending in the first direction 821. The evaporation apparatus 800 further includes a first gas supply pipe 830 and a second gas supply pipe 840 having openings 850. The first and the second gas supply pipes 830 and 840 may be first and second gas supply pipes as described before.

According to some embodiments, the openings of the second gas supply pipe may improve the uniformity of the material deposition by having different sizes. In the embodiment shown in FIG. 13, the openings have alternating sizes. As can be seen in FIG. 13, the openings 850 of the second gas supply pipe 840 are larger at positions corresponding to positions of crucibles of the first set of crucibles 810 than at positions corresponding to positions of crucibles of the second set of crucibles 880.

Although FIG. 13 only shows a second gas supply pipe, a third gas supply pipe may be provided as described before. According to some embodiments, the third gas supply pipe may have openings of differing sizes, additionally or alternatively to the openings of differing sizes of the second gas supply pipe. In particular, the openings of the third gas supply pipe may be larger at positions corresponding to positions of crucibles of the second set of crucibles than at positions corresponding to positions of crucibles of the first set of crucibles.

Figure 14:
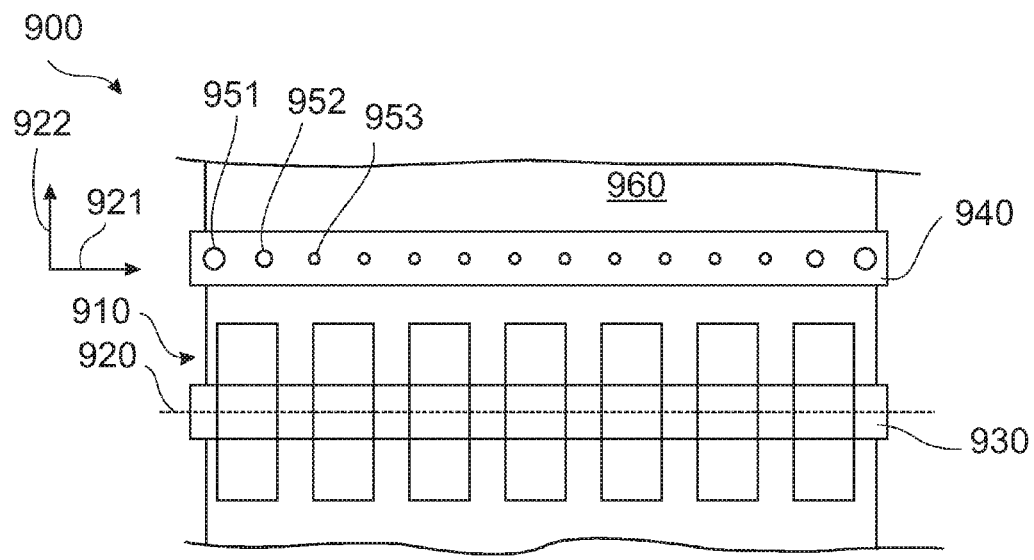
FIG. 14 shows a schematic top view of an evaporation apparatus with a first gas supply pipe and a second gas supply pipe having openings according to embodiments described herein.

FIG. 14 shows an embodiment of an evaporation crucible 900 including a first set of crucibles 910 aligned along a first line 920 extending in a first direction 921, which may extend substantially perpendicular to a second direction 922. The second direction 922 may be the direction of movement of the substrate 960 to be coated. The evaporation apparatus 900 further includes a first gas supply pipe 930 and a second gas supply pipe 940 having openings 950. The first and the second gas supply pipes 930 and 940 may be first and second gas supply pipes as described before.

The embodiment shown in FIG. 14 provides openings of the second gas supply pipe 940 having a size depending on the position of the opening in the first direction to improve the uniformity of the material deposition on the substrate. For instance, opening 951 has a larger diameter than opening 952 being located at another position along the first line. Further, in the embodiment shown in FIG. 14, the opening 953 has a smaller diameter than the openings 951 and 952. According to some embodiments, the size (i.e. the diameter in case of a circular opening) of the opening may increase towards the outer edge of the substrate 960 to be coated for improving the uniformity of the coating.

Figure 15:
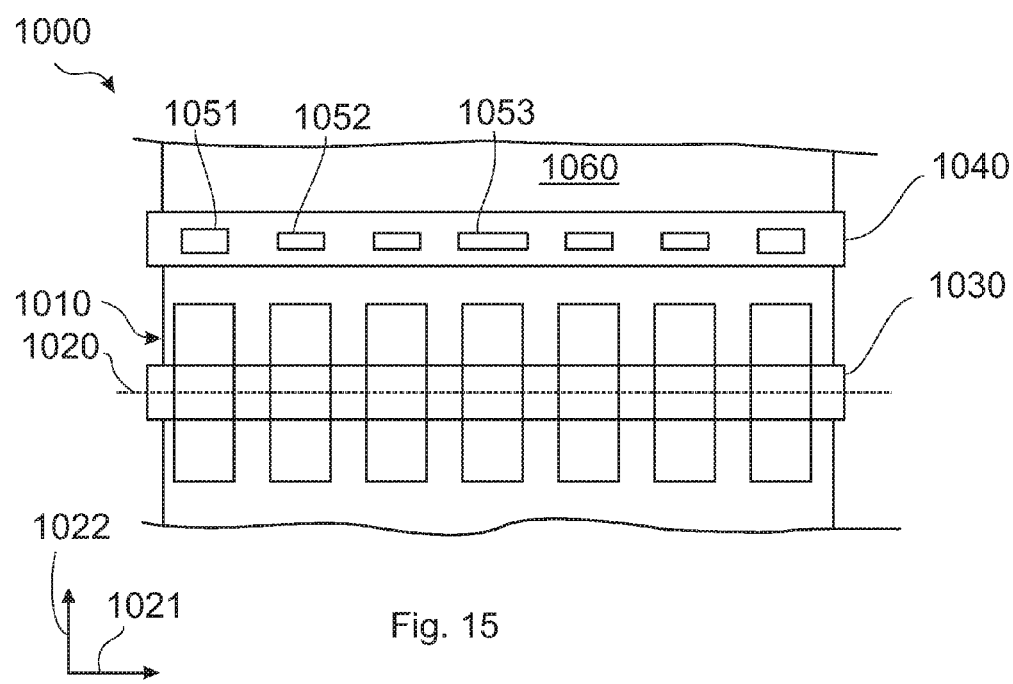
FIG. 15 shows a schematic top view of an evaporation apparatus with a first gas supply pipe and a second gas supply pipe having openings according to embodiments described herein.

FIG. 15 shows an embodiment of an evaporation apparatus 1000, which includes a first set of crucibles 1010 being aligned along a first line 1020 extending in a first direction 1021. A second direction 1022 is substantially perpendicular to the first direction 1021. The evaporation apparatus 1000 shown in FIG. 15 further includes a first gas supply pipe 1030 arranged between the first set of crucibles 1010 and the substrate support supporting substrate 1060 to be coated. A second gas supply pipe 1040 is provided for supplying gas to the first set of crucibles 1010. The second gas supply pipe 1040 may have openings which act as a gas outlet.

In the embodiment shown in FIG. 15, the openings are rectangular. According to some embodiments, the size of the openings differs, which can be seen by the different sizes of openings 1051, 1052, and 1053 in FIG. 15. Apart from the differing size, the openings 1051, 1052, and 1053 have different dimensions compared to each other. For instance, the length and/or the width of the rectangular openings may differ from opening to openings along the first direction.

In the figures, the openings in the gas supply pipes are mostly shown in a substantially circular shape. However, it should be understood that embodiments described herein are not limited to the circular or rectangular shapes shown in the examples of the figures. Rather, the openings may have other shapes, such as an oval shape, a ring-like shape, a triangular-like shape, a polygon-like shape, or any shape suitable for delivering gas to the evaporation process, or in case of the second and the third gas supply pipe, suitable to improve the uniformity of the layer coated on the substrate.

Figure 16:
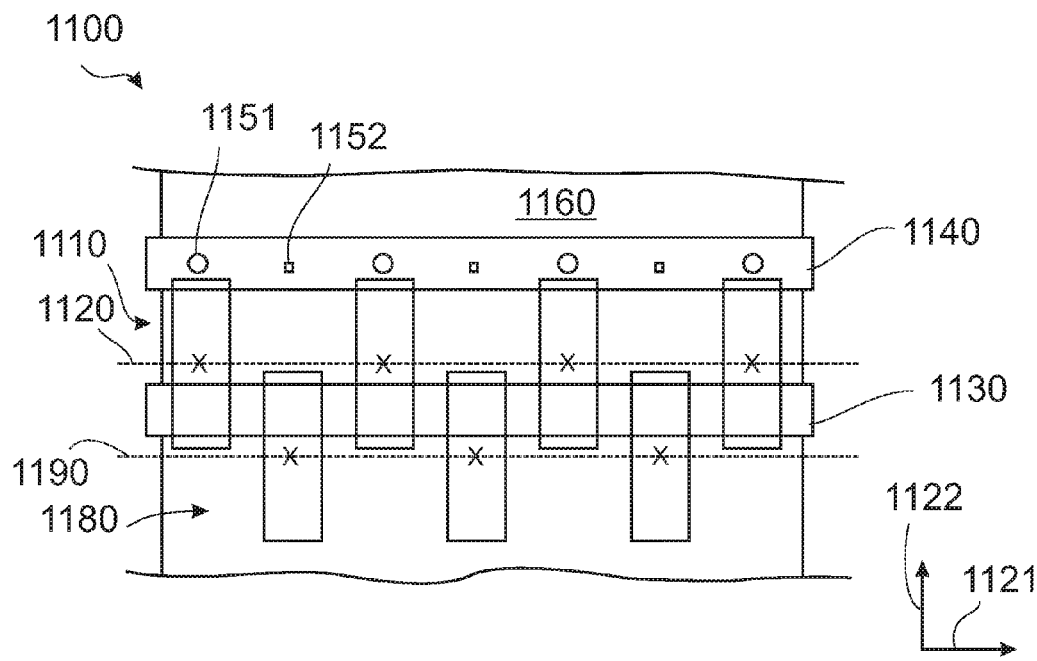
FIG. 16 shows a schematic top view of an evaporation apparatus with a first gas supply pipe and a second gas supply pipe having openings according to embodiments described herein.

FIG. 16 shows an embodiment of an evaporation apparatus 1100 including a first set of crucibles 1110 aligned along a first line 1120 extending in a first direction 1121, which may extend substantially perpendicular to a second direction 1122. The second direction 1122 may be the direction of movement of the substrate 1160 to be coated. Also, a second set of crucibles 1180 is provided aligned along a second line 1190 extending in the first direction 1121. The evaporation apparatus 1100 further includes a first gas supply pipe 1130 and a second gas supply pipe 1140 having openings 1150. The first and the second gas supply pipes 1130 and 1140 may be first and second gas supply pipes as described before.

According to some embodiments described herein, the openings in the second gas supply pipe 1140 may have differing shapes. In one embodiment, the openings of the second gas supply pipe 1140 being located at positions along the first direction, which correspond to the positions of the crucibles of the first set of crucibles 1110, may have a first shape. The openings of the second gas supply pipe 1140 being located at positions along the first direction, which correspond to the positions of the crucibles of the second set of crucibles 1180, may have a second shape different from the first shape. For instance, the opening 1151 may have a substantially circular shape, while opening 1152 may have a substantially rectangular shape. The different shapes at defined positions along the first direction taking into account the stoichiometric conditions may result in a uniform material deposition.

It should be understood that, although the feature of the differing shapes of the openings is described with respect to the second gas supply pipe, the third gas supply pipe may also be equipped with differently shaped openings, additionally or alternatively to the openings in the second gas supply pipe.

Figure 17:
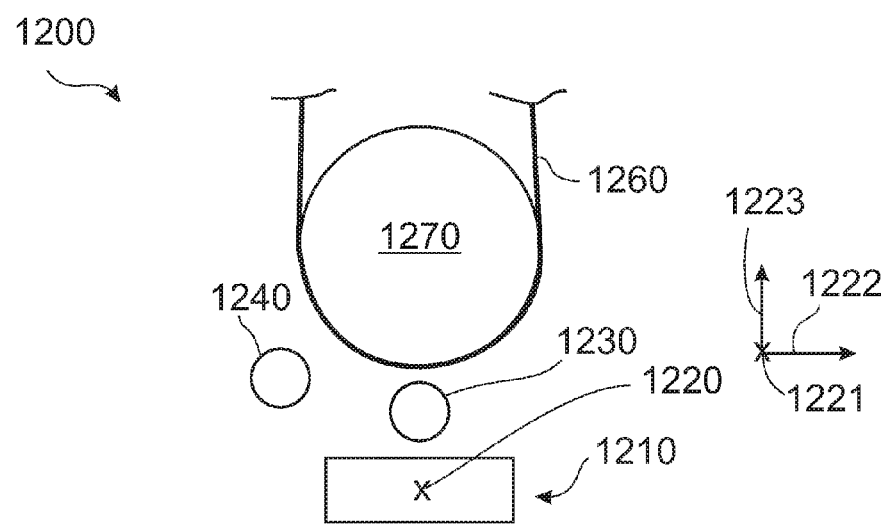
FIG. 17 shows a schematic front view of an evaporation apparatus with a first gas supply pipe and a second gas supply pipe according to embodiments described herein.

FIG. 17 shows a front view of an embodiment of an evaporation apparatus 1200. The evaporation apparatus 1200 shows a drum 1270 for supporting the substrate 1260 to be coated. The first set of crucibles 1210 can be seen being arranged along line 1220 extending in the first direction 1221. The evaporation apparatus 1200 further includes a first gas supply pipe 1230 being arranged between at least one of the evaporation crucibles of the first set of evaporation crucibles 1210 and the drum 1270. Also, a second gas supply pipe 1240 can be seen in FIG. 12 for providing a gas between the first set of evaporation crucibles 1210 and the drum 1270 with openings shaped and positioned to improve the uniformity of the deposition of the material. In the embodiment of FIG. 17, which may be combined with further embodiments described above (such as embodiments shown in FIGS. 1 to 16), the uniformity of the layer to be deposited may be improved by providing gas for the deposition process by the openings of the second gas supply 1240 having a smaller distance to the drum 1270 than the first gas supply pipe 1230 in the third direction 1223 being substantially perpendicular to the first direction 1221 and the second direction 1222.

The skilled person will recognize that the features described in the embodiments above, may be combined with other features described herein. In particular, the features described in FIGS. 12, 13, 14, 15, 16, and 17 referring to the shaping and the positioning of the openings in the first, second and/or third gas supply pipe may be combined with evaporation apparatus arrangement described in other embodiments, such as the embodiments described in FIGS. 1 to 11 (as long as they do not contradict each other). Especially the features referring to the displacement of the openings to each other in the second direction, the different sizes of the openings dependent on the position of the crucibles, the different sizes of the openings dependent on the position in the first direction, the different kind of shapes of the openings, and the different shapes of the openings dependent on the position of the crucibles, may be combined with the embodiments, or used in the evaporation apparatuses described in the embodiments of FIGS. 1 to 11.

According to some embodiments, the evaporation process takes places in a vacuum atmosphere, such as at a pressure of several $10^{-4}$ hPa. It should be understood that the supply of gas from the second and/or third gas supply pipe do not substantially amend the pressure during the evaporation process as the gas is bonded by the material formed as deposited layer. Generally, the gas flow in the gas pipes depends on the size of the evaporation apparatus and the size of the substrate to be coated. In one embodiment of the evaporation apparatus may be provided for coating a substrate having a coating width in the first direction of typically between about 1200 mm to about 4500 mm, more typically between about 1250 mm and about 4450 mm, for instance 2450 mm. The gas supply pipes may provide a gas flow of typically between about 5000 sccm and about 50000 sccm, more typically between about 7000 sccm and about 50000 sccm, and even more typically between about 7000 sccm and about 20000 sccm. In particular, the gas flow in the evaporation apparatus according to embodiments described herein may be distributed to the two or three gas supply pipes. For instance, the gas flow may be distributed in equal parts to the first gas supply pipe and the second gas supply pipe. However, it should be understood that the distribution of the gas flow in the gas supply pipes depends i.a. on the stoichiometry set and/or the layer thickness desired, such that the above example should not be understood in a limiting way. Rather, each arbitrary distribution of the gas flow in the gas supply pipes may be chosen for a respective purpose.

In one embodiment, the second and/or the third gas supply pipe is adapted for ensuring an almost constant gas supply through the openings along the first direction from the first opening to the last opening of the gas supply pipe. For instance, the size of the openings may be adapted to the diameter of the gas supply pipes. In one embodiment, the opening size increases for an increasing pipe diameter. According to some embodiments, the gas supply pipes and the openings may be configured to be used in a vacuum environment. The gas supply pipes and the openings may be configured to deliver a constant gas supply over the width of the substrate to be coated in the first direction under vacuum conditions.

According to some embodiments, the diameter of a gas pipe as described herein may be typically between about 10 mm and about 30 mm, more typically between about 12 mm and about 20 mm, and even more typically between about 12 mm and about 18 mm. In some embodiments, the openings in the gas supply pipes may be between about 0.5 mm and about 1.5 mm, more typically between about 0.8 mm and about 1.2 mm, and even more typically between about 0.8 mm and about 1.0 mm. In one example, the evaporation apparatus is adapted for coating substrates having a width up to 2450 mm, and includes a gas supply pipe having a diameter of 12 mm with an opening diameter of 0.8 mm.

Generally, the herein described evaporation apparatus may be used in an evaporation system including a supply drum for providing the substrate to be coated and a take-up drum for storing the substrate after coating. The evaporation system may include further components, such as further drums or rolls for guiding and/or tensioning the substrate to be coated, cooling means for cooling the substrate during the deposition process, a control unit for monitoring and controlling the operation of the evaporation system, closed-loop automatic layer control, self-diagnostic out-of-range monitoring, high rate evaporation sources, and the like. In one embodiment, the evaporation system, in which the evaporation apparatus according to embodiments described herein may be used, may be adapted for avoiding contact of the coated side of the substrate with components of the system, such as guiding and tensioning rolls. Generally, the evaporation apparatus described herein may be an evaporation apparatus suitable for being used in a vacuum deposition process. The evaporation apparatus may include components for maintaining a vacuum during operation, such as high-performance pumping systems, vacuum pumps, seals, and the like. According to some embodiments, the evaporation system, in which the herein described evaporation apparatus may be used, may be adapted for producing 20 nanometer thin, clear barrier coatings on PET substrates. In one embodiment, the evaporation system may be adapted for depositing a ten nanometer thin layer on the substrate. In one embodiment, the evaporation apparatus according to embodiments described herein may be used in an evaporation system for substrates to be coated over a width ranging from about 650 mm to about 4500 mm. The evaporation apparatus may be adapted for guiding the substrate with a speed of up to 17 meters-per-second.

With embodiments described herein, the optical appearance of the finished product, such as the coated substrate may be achieved by improving the uniformity of the deposited layer. With the evaporation apparatus according to embodiments described herein, a higher transparency for product visibility can be achieved while the operating costs are not significantly increased. Further, achieving a high uniformity of the deposited layer by shaping and positioning the openings of the gas supply pipes accordingly results in low defect rates of the finished product.

While the foregoing is directed to embodiments of the invention, other and further embodiments of the invention may be devised without departing from the basic scope thereof, and the scope thereof is determined by the claims that follow.

The invention claimed is:

1. An evaporation apparatus for depositing a material on a substrate supported by a drum, the evaporation apparatus comprising:
    a first set of evaporation crucibles aligned at a first set of positions along a first line extending in a first direction and a second set of evaporation crucibles aligned at a second set of positions along a second line extending in the first direction, wherein the first line and the second line are displaced to each other in a second direction perpendicular to the first direction and parallel;
    a first gas supply pipe extending in the first direction across at least a width of the substrate to be processed configured for supplying gas for the first set of evaporation crucibles and the second set of evaporation crucibles; and
    a second gas supply pipe extending in the first direction across at least the width of the substrate to be processed configured for supplying gas for the first set of evaporation crucibles, wherein the second gas supply pipe comprises gas outlet openings, and wherein each of the gas outlet openings is provided at each of a third set of positions on the second supply pipe aligned with each of the first set of positions and none of the gas outlet openings are provided at a fourth set of positions on the second supply pipe aligned with the second set of positions.

2. The evaporation apparatus according to claim 1, wherein the first line of the first set of evaporation crucibles is defined through the center of at least two crucibles in the first set of crucibles and the second line of the second set of evaporation crucibles is defined through the center of at least two crucibles in the second set of crucibles.

3. The evaporation apparatus according to claim 1, further comprising a third gas supply pipe extending in the first direction across at least the width of the substrate to be processed configured for supplying gas for the second set of evaporation crucibles, wherein the third gas supply pipe comprises gas outlet openings, and wherein each of the gas outlet openings is provided at each of a fifth set of positions on the third gas supply pipe aligned with each of the second set of positions and none of the gas outlet openings are provided at a sixth set of positions on the third gas supply pipe aligned with the first set of positions.

4. The evaporation apparatus according to claim 2, wherein the first line and the second line displaced to each other by larger than about 40 mm in the second direction.

5. The evaporation apparatus according to claim 2, wherein the first line and the second line are displaced to each other by equal to or larger than about 60 mm in the second direction.

6. The evaporation apparatus according to claim 2, wherein at least one evaporation crucible of the first set of evaporation crucibles comprises an overlapping portion overlapping with a portion of an evaporation crucible of the second set of evaporation crucibles in the first direction.

7. The evaporation apparatus according to claim 2, further comprising a third gas supply pipe extending in the first direction across at least the width of the substrate to be processed configured for supplying a gas between the second set of evaporation crucibles and the drum through openings shaped and positioned to improve uniformity of deposition of the material.

8. The evaporation apparatus according to claim 1, wherein the second gas supply pipe is displaced to the first gas supply pipe in the second direction.

9. The evaporation apparatus according to claim 7, wherein the third gas supply pipe is displaced to the first gas supply pipe in the second direction.

10. The evaporation apparatus according to claim 7, wherein the second gas supply pipe and the third gas supply pipe are arranged at opposite sides of the first gas supply pipe.

11. The evaporation apparatus according to claim 7, wherein the third gas supply pipe improves the uniformity of the deposition of the material by at least one of providing the openings at positions on the third gas supply pipe aligned with the second set of positions and by not providing the openings at positions on the third gas supply pipe aligned with the first set of positions.

12. The evaporation apparatus according to claim 1, wherein the second gas supply pipe provides the gas outlet openings of varying sizes.

13. The evaporation apparatus according to claim 7, wherein the third gas supply pipe provides the openings of varying sizes.

14. The evaporation apparatus according to claim 12, wherein the size of the gas outlet openings of the second gas supply pipe varies dependent on the position of the gas outlet openings along the first direction.

* * * * *